United States Patent [19]
Cho

[11] Patent Number: 5,933,711
[45] Date of Patent: Aug. 3, 1999

[54] FABRICATION METHOD FOR CHIP SIZE SEMICONDUCTOR PACKAGE

[75] Inventor: Jae Weon Cho, Cheongju, Rep. of Korea

[73] Assignee: LG Semicon Co., Ltd., Cheongju, Rep. of Korea

[21] Appl. No.: 09/050,917

[22] Filed: Mar. 31, 1998

[30] Foreign Application Priority Data

Nov. 15, 1997 [KR] Rep. of Korea ............ 97 60261

[51] Int. Cl.[6] .................. H01L 21/44; H01L 21/48; H01L 21/50
[52] U.S. Cl. .................. 438/123; 438/106; 438/121
[58] Field of Search .................. 438/123, 121, 438/106

[56] References Cited

U.S. PATENT DOCUMENTS

| | | | |
|---|---|---|---|
| 5,476,211 | 12/1995 | Khandros | 228/180.5 |
| 5,480,841 | 1/1996 | Bickford et al. | 438/127 |
| 5,683,944 | 11/1997 | Joiner et al. | 438/123 |
| 5,731,231 | 3/1998 | Miyajima | 438/123 |

*Primary Examiner*—Kevin M. Picardat
*Assistant Examiner*—Deven Collins
*Attorney, Agent, or Firm*—Fleshner & Kim

[57] ABSTRACT

A fabrication method for a chip size semiconductor package, includes providing a conductive package frame having a plurality of paddles which are each supported from the frame by a plurality of tie bars, adhering a semiconductor chip to each paddle, connecting each of the semiconductor chips to the frame by a plurality of wires, plating a conductive material onto each wire, forming an insulating layer on a surface of each semiconductor chip, cutting each wire to form a lead, and removing the plurality of tie bars to separate the completed package from the frame.

16 Claims, 6 Drawing Sheets

FABRICATION METHOD FOR CHIP SIZE SEMICONDUCTOR PACKAGE

BACKGROUND OF THE INVENTION

1. Field of the Invention

The present invention relates to a fabrication method for a chip size semiconductor package (CSP), and in particular to an improved fabrication method for forming a CSP package by directly bonding conductive wires on bonding pads formed on a semiconductor chip.

2. Description of the Conventional Art

FIGS. 1A to 1F sequentially illustrate a conventional CPS fabrication method.

First, as shown in FIG. 1A, a semiconductor chip (or a wafer) 11 is provided with a plurality of bonding pads 13, and a passivation layer 15 is formed on the surface of the semiconductor chip 11, excluding the bonding pads 13. Next, as shown in FIG. 1B, a first conductive layer 17 of TiW and a second conductive layer 19 of Au are sputtered and sequentially deposited on the bonding pads 13 and passivation layer 15. And, as shown in FIG. 1C, one end of a conductive wire 21 made of a material such as Au is bonded to a part of the second conductive layer 19 formed on each of the bonding pads 13 and the conductive wire 21 is cut to a length of 1–2 mm, and thus the conductive wire 21 is formed straight or curved. The second conductive layer 19 is used as a common terminal in a subsequent electroplating process. Then, as shown in FIG. 1D, a photo resist 23 is deposited on the second conductive layer 19 excluding the parts under which the bonding pads 13 are formed. As shown in FIG. 1E, in order to strengthen the conductive wire 21, Ni plating material is coated on the outer surface of the conductive wire 21. And then, as shown in FIG. 1F, Au material 27 is plated on the surface of the Ni plated conductive wire 21. The Au plating 27 improves an electrical solder joint between the conductive wire 21 and a printed circuit board and prevents the conductive wire 21 from being corroded when mounting the CSP on the printed circuit board. Here, electroplating is used for plating the Au and Ni. Lastly, after the photo resist 23 is removed, the first and second conductive layers 17 and 19 except where each bonding pad 13 is formed are removed by etching.

As described above, the conventional CSP fabrication method requires the sputtering, photo resist deposition, and etching applied for strengthening the conductive wire 21, improving solder ability, and preventing the corrosion of the conductive wire 21, which are all highly difficult and costly in performing. In addition, moisture penetrates through the connecting surface between the semiconductor chip 11 and the conductive wire 21, and the surface of the semiconductor chip 11 is externally exposed (when completely formed as CSP), thereby being unable to endure a strong external mechanical impact.

SUMMARY OF THE INVENTION

Accordingly, it is an object of the present invention to provide a fabrication method for a chip size semiconductor package (CSP) capable of reducing a manufacturing cost by which a conventional package fabrication art such as a SOJ package is still applied, preventing moisture from being penetrated into the CSP by coating the surface of the semiconductor chip, and enduring a strong external impact, thereby improving reliability of the CPS.

To achieve the above objects, there is provided a fabrication method for a CSP, which includes the steps of providing a conductive package frame having a paddle supported to the frame by a plurality of tie bars; adhering a semiconductor chip to the paddle; connecting the semiconductor chip and the frame together by a plurality of wires; plating a conductive material onto each wire; forming an insulating layer on a surface of the semiconductor chip; cutting a predetermined part of each wire; and removing the plurality of tie bars to thereby separate the semiconductor chip from the frame.

In the above plating step, Ni and Au are sequentially plated on the wires, thereby strengthening the wires and preventing the wires from being corroded, and improving a solder joint.

Electroplating is employed for the plating process, using the package frame as a common electrical terminal. Therefore, since the electroplating is performed by using the conductive frame as the common terminal, the process can be simplified.

In addition, the insulating layer is formed of an epoxy compound. Therefore, the semiconductor chip can be protected against an external impact and moisture penetration into the chip by coating the surface of the semiconductor chip with the epoxy compound.

Additional advantages, objects and features of the invention will more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

With reference to accompanying drawings, the fabrication method of a CSP according to the present invention will now be described in detail.

FIGS. 2A to 2G are sequential plan views illustrating a fabrication method of a CSP according to the present invention, and FIGS. 3A to 3G are sequential vertical cross-sectional views illustrating the fabrication method of the CSP according to the present invention.

Figure 1A:
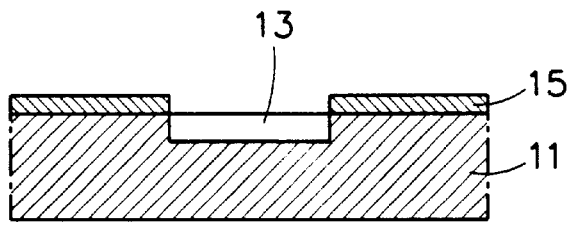
FIGS. 1A to 1F are sequential vertical cross-sectional views illustrating a fabrication method of a conventional chip size semiconductor package (CSP)
Figure 1B:
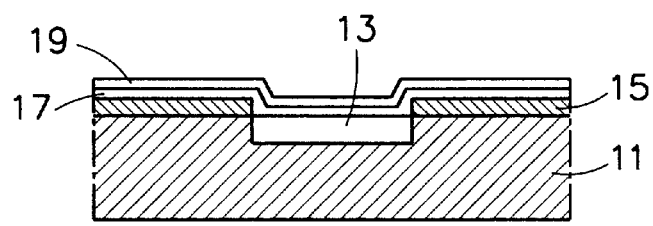
Figure 1C:
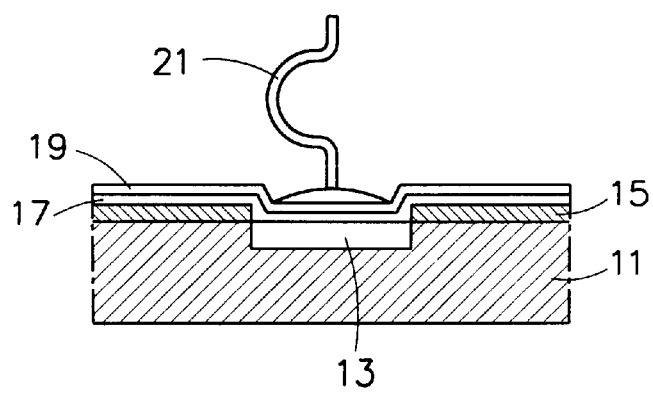
Figure 1D:
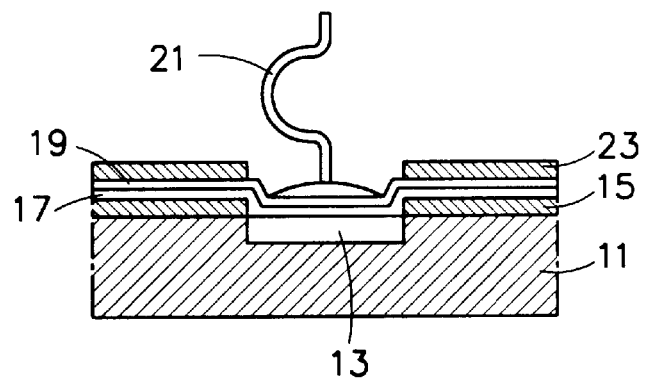
Figure 1E:
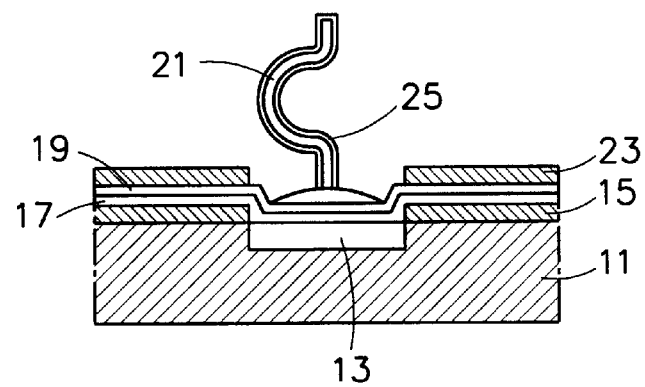
Figure 1F:
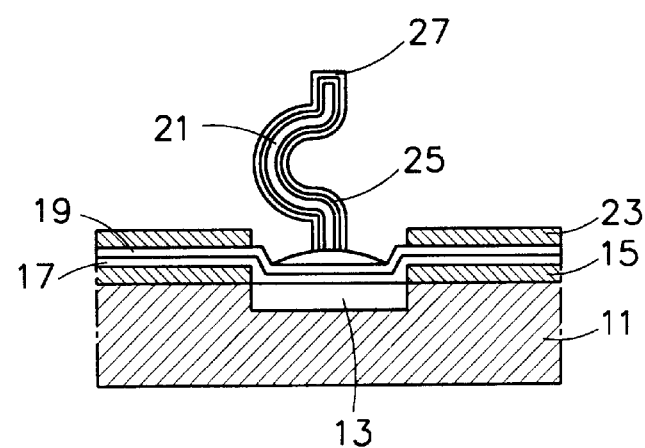
Figure 2A:
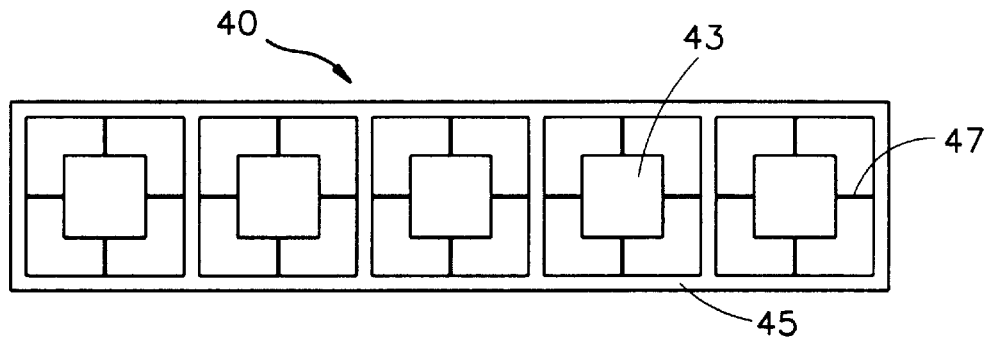
FIGS. 2A to 2G are sequential plan views illustrating a fabrication method of a CSP according to the present invention.
Figure 3A:
FIGS. 3A to 3G are sequential vertical cross-sectional views illustrating the fabrication method of the CSP according to the present invention.

First, as shown in FIGS. 2A and 3A, a package frame 40 is provided. The package frame 40 includes a plurality of paddles 43, a conductive frame 45 which surrounds each paddle 43, and a plurality of tie bars 47, connected between each paddle 43 and the conductive frame 45, for supporting the plurality of paddles 43.

Figure 2B:
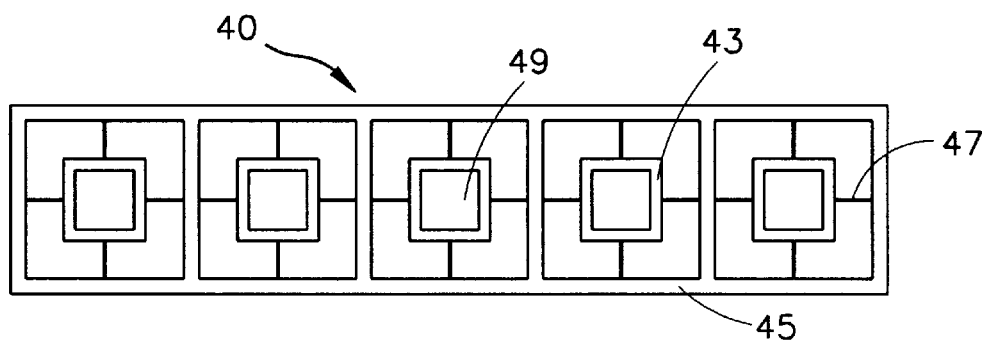
Figure 3B:
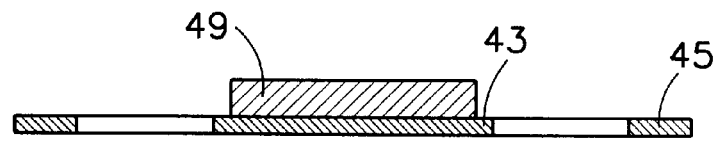

Next, as shown in FIGS. 2B and 3B, a semiconductor chip 49 is adhered on each paddle 43. Here, the semiconductor chips 49 are adhered by an insulating adhesive film (not illustrated) or an insulating adhesive (not illustrated).

Figure 2C:
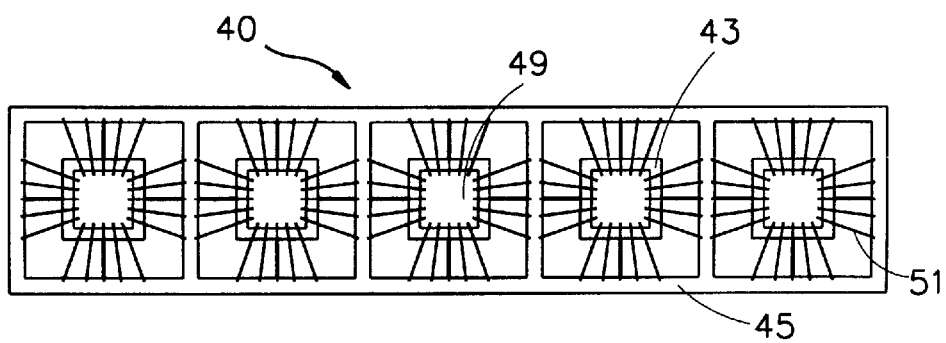
Figure 3C:
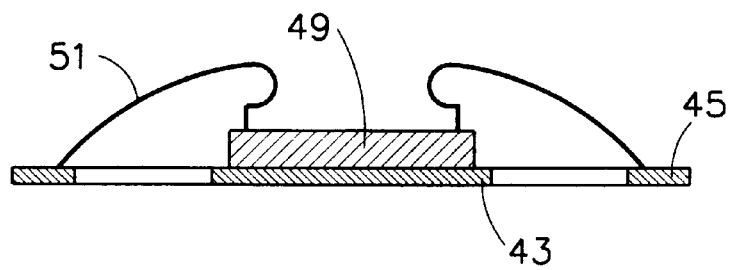

And, as shown in FIGS. 2C and 3C, a plurality of bonding pads (not illustrated) formed on each of the semiconductor chips 49 are connected to the conductive frame 45 by a plurality of conductive wires 51.

Figure 2D:
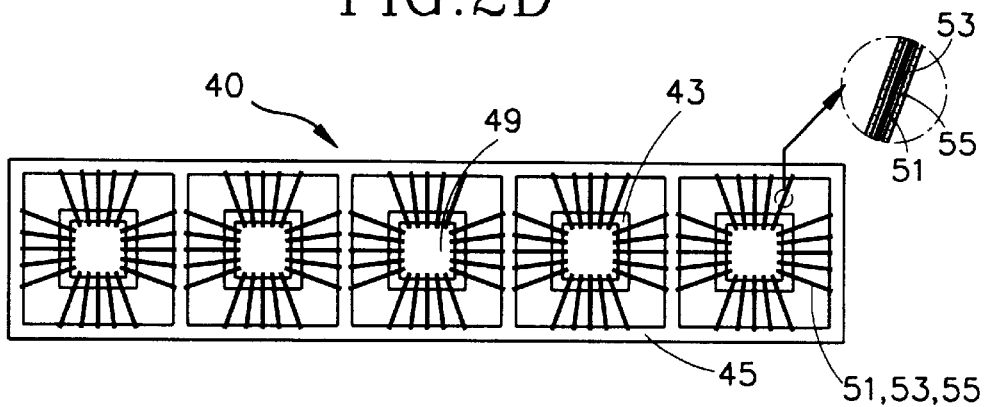
Figure 3D:
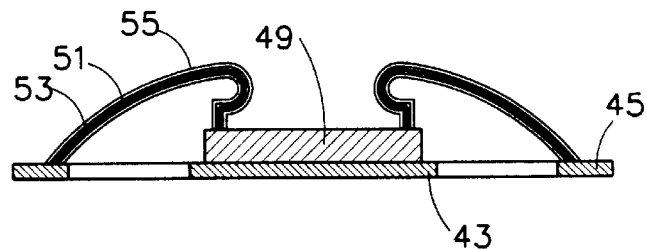

As shown in FIGS. 2D and 3D, Ni and Au are sequentially plated onto each of the conductive wires 51, thereby forming Ni and Au layers 53 and 55. An electroplating process is employed for forming the Ni and Au layers 53 and 55, and the conductive frame 45 is used as a common electrical terminal when performing the electroplating.

Figure 2E:
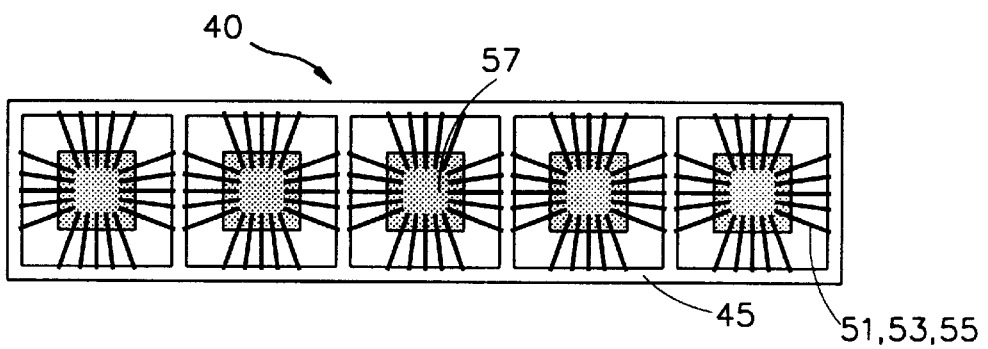
Figure 2F:
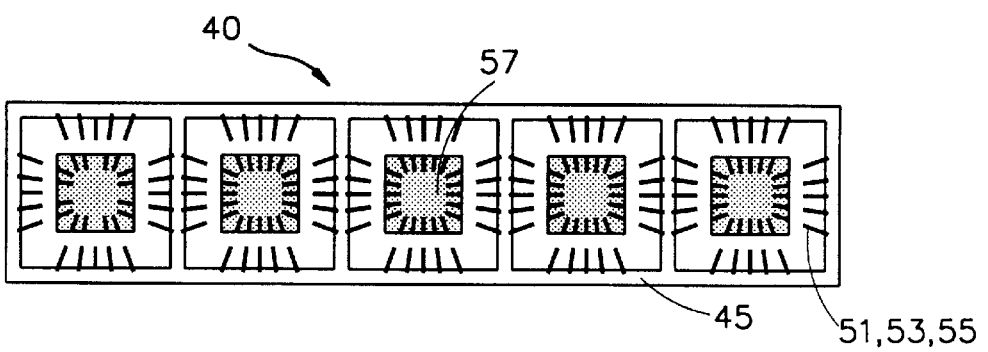
Figure 3E:
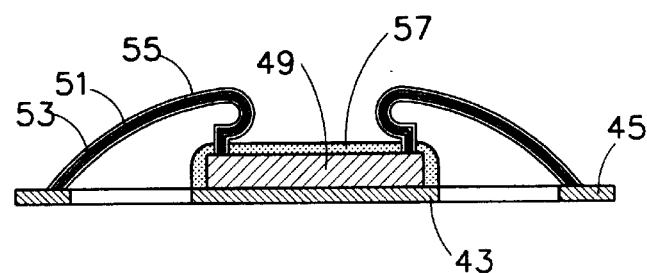
Figure 3F:
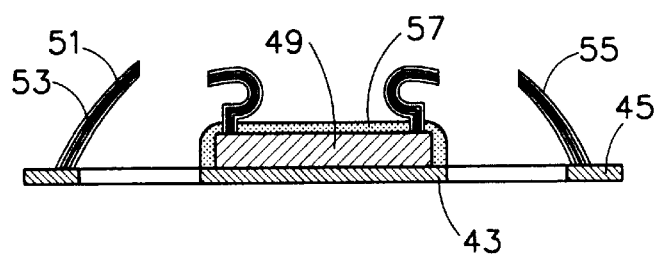

As shown in FIGS. 2E and 3E, an epoxy compound layer 57, an insulator, is formed on the surface of each of the semiconductor chips 49, and as shown in FIGS. 2F and 3F, the conductive wires 51 coated with the Ni and Au layers 53 and 55 are cut to a predetermined length to form external leads. Each of the conductive wires 51 provides an electrical path for externally conducting electric signals to and from the semiconductor chip 49 and serves as a connection lead for mounting the CSP to corresponding solder pads of a PCB or substrate (not shown).

Figure 2G:
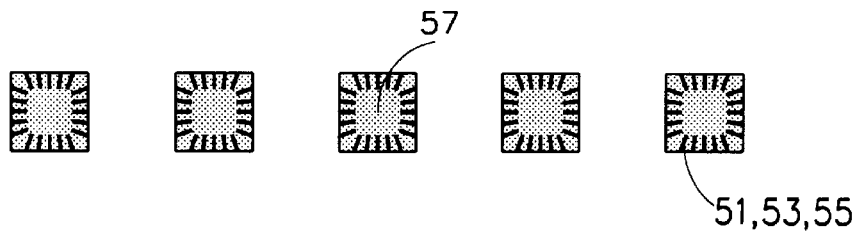
Figure 3G:
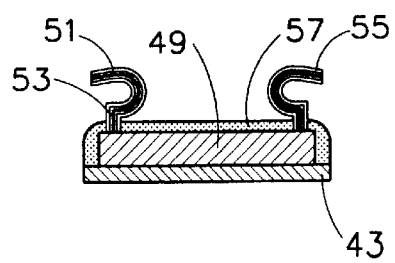

Lastly, as shown in FIGS. 2G and 3G, the plurality of tie bars 47 are removed, whereby each of the semiconductor chips 49 is separated from the conductive frame 45.

As described above, the fabrication method for the CSP according to the present invention is capable of reducing the manufacturing cost since the conventional semiconductor package fabrication art can be applied thereto as it is, of preventing moisture from being penetrated into the CSP through the bonding pads thereof by coating the surface of the semiconductor chip with the insulator after the wire bonding process, and of resisting a strong external impact since there exists the metal paddle under the semiconductor chip.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A fabrication method for a chip size semiconductor package (CSP), comprising:
   providing a conductive package frame having a paddle which is supported from a conductive frame by a plurality of tie bars;
   mounting a semiconductor chip to said paddle;
   connecting the semiconductor chip and the frame together by a plurality of wires;
   plating a conductive material onto each said wire;
   forming an insulating layer on a surface of the semiconductor chip;
   cutting each wire; and
   removing the plurality of tie bars for thereby separating the semiconductor chip from the frame.

2. The method of claim 1, wherein the conductive material plated onto each wire is a layer of Ni followed by a layer of Au.

3. The method of claim 2, wherein for the plating step an electroplating process is employed.

4. The method of claim 3, wherein during the electroplating the conductive frame is used as a common electrical terminal.

5. The method of claim 1, wherein the insulating layer is formed of an epoxy compound.

6. The method of claim 1, wherein the package frame supports a plurality of paddles, and wherein a corresponding plurality of semiconductor chips are each mounted to a respective one of the paddles.

7. A method of fabricating a chip package, comprising the steps of:
   mounting a chip on a package frame that includes a paddle supported on the frame by a plurality of tie bars;
   attaching first ends of a plurality of wires to bond pads of the chip;
   attaching second ends of the plurality of wires to the package frame;
   plating a conductive material onto the plurality of wires; and
   packaging the chip and the first ends of the plurality of wires with a molding compound.

8. The method of claim 7, further comprising the step of cutting the plurality of wires and removing the tie bars to separate the packaged chip from the package frame.

9. The method of claim 7, wherein the plating step comprises the steps of:
   plating a layer of Ni onto the plurality of wires; and
   plating a layer of Au onto the Ni layer.

10. The method of claim 9, wherein the plating step comprises using the package frame as a common electrical terminal during the plating process.

11. The method of claim 7, wherein the plating step comprises using the package frame as a common electrical terminal during the plating process.

12. The method of claim 11, further comprising the step of cutting the plurality of wires and removing the tie bars to separate the packaged chip from the package frame.

13. A method of fabricating a chip package, comprising the steps of:
   attaching a chip to a package frame;
   attaching first ends of a plurality of wires to bond pads of the chip;
   attaching second ends of the plurality of wires to the package frame;
   plating the wires with a conductive material;
   packaging the chip and the first ends of the plurality of wires with a molding compound; and
   cutting the wires to separate the packaged chip from the package frame.

14. The method of claim 13, wherein the plating step comprises the steps of:
   plating a layer of Ni onto the plurality of wires; and
   plating a layer of Au onto the Ni layer.

15. The method of claim 14, wherein the plating step comprises using the package frame as a common electrical terminal during the plating process.

16. The method of claim 13, wherein the plating step comprises using the package frame as a common electrical terminal during the plating process.

* * * * *